United States Patent
Jung

(10) Patent No.: US 8,773,189 B2
(45) Date of Patent: Jul. 8, 2014

(54) DOMAIN CROSSING CIRCUIT OF SEMICONDUCTOR APPARATUS

(71) Applicant: SK hynix Inc., Icheon-si (KR)

(72) Inventor: Jong Ho Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/757,248

(22) Filed: Feb. 1, 2013

(65) Prior Publication Data

US 2014/0055183 A1 Feb. 27, 2014

(30) Foreign Application Priority Data

Aug. 24, 2012 (KR) .................. 10-2012-0093240

(51) Int. Cl.
*G06F 1/04* (2006.01)
(52) U.S. Cl.
USPC .......................................... 327/291
(58) Field of Classification Search
USPC .......................................... 327/291
See application file for complete search history.

(56) References Cited

U.S. PATENT DOCUMENTS

2006/0117204 A1* 6/2006 Janzen .................. 713/401
2010/0164572 A1* 7/2010 Kim .................. 327/158

FOREIGN PATENT DOCUMENTS

KR 100791001 B1 12/2007

* cited by examiner

*Primary Examiner* — Daniel Rojas
(74) *Attorney, Agent, or Firm* — William Park & Associates Patent Ltd.

(57) ABSTRACT

A domain crossing circuit of a semiconductor apparatus includes a delay-locked loop block configured to generate a delay-locked loop clock signal in response to a clock signal and a clock enable signal; a clock enable block configured to generate the clock enable signal in response to the clock signal and a read command signal; and a command pass block configured to perform primary latency control according to the clock signal and secondary latency control according to the delay-locked loop clock signal, for the read command signal generated in response to a strobe signal, and generate a latency signal.

12 Claims, 8 Drawing Sheets

DOMAIN CROSSING CIRCUIT OF SEMICONDUCTOR APPARATUS

CROSS-REFERENCES TO RELATED APPLICATION

The present application claims priority under 35 U.S.C. §119(a) to Korean application number 10-2012-0093240, filed on Aug. 24, 2012, in the Korean Intellectual Property Office, which is incorporated herein by reference in its entirety.

BACKGROUND

1. Technical Field

The present invention generally relates to a semiconductor apparatus, and more particularly, to a domain crossing circuit of a semiconductor apparatus.

2. Related Art

Referring to FIG. 1, a conventional domain crossing circuit 1 of a semiconductor apparatus includes a first buffer (BUF) 10, a delay-locked loop block 20, a second buffer (BUF) 30, a command decoder (CMD DEC) 40, a command timing control block (CMD CTRL) 50, a latency control block 60, a clock enable block (CLKEN GEN) 70, an output timing control block (DQ CTRL) 80, and a transmission block (TX) 90.

The first buffer 10 receives an external clock signal CLK and outputs an internal clock signal ICLK.

The delay-locked loop block 20 is configured to output a delay-locked loop clock signal DLLCLK in response to the internal clock signal ICLK and a clock enable signal CLKEN.

The delay-locked loop block 20 outputs the delay-locked loop clock signal DLLCLK generated by correcting the delay time of the internal clock signal ICLK, in response to the clock enable signal CLKEN, such that the phases of the internal clock signal ICLK and an output data signal are synchronized.

The delay-locked loop block 20 includes a variable delay line (Variable Delay Line) 21, a replica delay (Replica Delay) 22, a phase detector (Phase Detector) 23, a DLL controller (DLL CTRL) 24, and a driver (DRV) 25. The replica delay 22 being capable of receiving a feedback clock signal FBCLK.

The second buffer 30 receives a column address strobe signal CAS and outputs an internal column address strobe signal PCAS.

The command decoder 40 decodes the internal column address strobe signal PCAS, a row address strobe signal RAS and a write enable signal WE, and outputs a command signal.

The command timing control block 50 shifts the output signal of the command decoder 40 by an address latency (AL), and outputs a read command signal RDCMD.

The latency control block 60 generates a latency signal LATENCY and an enable period signal RDCLKEN in response to the read command signal RDCMD.

The latency control block 60 includes a variable delay line (Variable Delay Line) 61 and a shift block (Latency Shift) 62.

The variable delay line 61 delays the read command signal RDCMD by a varied delay time and outputs a read command delayed signal RDCMDD.

The shift block 62 shifts the read command delayed signal RDCMDD by a CAS latency (CL) on the basis of the delay-locked loop clock signal DLLCLK, and generates the latency signal LATENCY.

The clock enable block 70 generates the clock enable signal CLKEN in response to the internal clock signal ICLK, the read command signal RDCMD and the enable period signal RDCLKEN.

The output timing control block 80 controls the timing of the latency signal LATENCY by a preset value on the basis of the delay-locked loop clock signal DLLCLK, and outputs a resultant signal.

The transmission block 90 performs an operation of outputting data DQ (or DQ and DQS) (not illustrated) in response to the output signal of the output timing control block 80.

Operations of the conventional domain crossing circuit of a semiconductor apparatus configured as mentioned above will be described below with reference to FIG. 2 (see also FIG. 1).

The delay time from the external clock signal CLK to the delay-locked loop clock signal DLLCLK is tBUF+tVD+tDRV, (where tBUF is the delay time associated with the first buffer 10, tVD is the delay time associated with the variable delay line 21, and tDRV is the delay time associated with the driver 25) and the delay time from the column address strobe signal CAS to the read command delayed signal RDCMDD is tBUF+tCMD+tVD (where tBUF is the delay time associated with the second buffer 30, tCMD is the delay time associated with the command decoder 40 and the command timing control block 50, and tVD is the delay time associated with the variable delay line 61).

The delay time tDRV by the driver 25 is longer than the delay time tCMD by the command decoder 40 and the command timing control block 50.

Therefore, a timing margin tMARGIN decreases by tCMD−tDRV in the latency control block 60.

Additionally, FIGS. 1 and 2 illustrate a time delay associated with data tDQ with regards to the transmission block 90 and the output timing control block 80.

Further, the delay time from the external clock signal CLK to a delayed clock signal DCLK as the output signal of the variable delay line 21 is tBUF+tVD, whereas the delay time from the column address strobe signal CAS to the clock enable signal CLKEN is tBUF+tCMD+tCKEN (where tCKEN is the delay time associated with the clock enable block 70). Therefore, under the situation where tVD becomes very small and the inequality tVD<tCMD+tCKEN is satisfied, a time for generating the clock enable signal CLKEN is delayed, and thus, the first pulse of the delay-locked loop clock signal DLLCLK may have a very short activation period or may not be generated.

As a result, in the conventional art, a command (such as a read command, a write command, and the like) may not be precisely aligned with a clock signal, that is, the delay-locked loop clock signal DLLCLK, and the data output performance of the semiconductor apparatus may be degraded.

SUMMARY

A domain crossing circuit of a semiconductor apparatus which can precisely align a command with a clock signal is described herein.

In an embodiment, a domain crossing circuit of a semiconductor apparatus includes: a delay-locked loop block configured to generate a delay-locked loop clock signal in response to a clock signal and a clock enable signal; a clock enable block configured to generate the clock enable signal in response to the clock signal and a read command signal; and a command pass block configured to perform primary latency control according to the clock signal and secondary latency control according to the delay-locked loop clock signal, for the read command signal generated in response to a strobe signal, and generate a latency signal.

In an embodiment, a domain crossing circuit of a semiconductor apparatus includes: a delay-locked loop block configured to generate a delay-locked loop clock signal in response to a clock signal and a clock enable signal; a clock enable block configured to generate the clock enable signal in response to the clock signal and a column address strobe signal; and a command pass block configured to sequentially perform compensation of a delay time corresponding to an internal delay time of the delay-locked loop block, primary latency control and secondary latency control according to the delay-locked loop clock signal, for a read command signal generated in response to the column address strobe signal, and generate a latency signal.

Thanks to the above embodiments, a command can be precisely aligned with a clock signal, and thus, not only stable operations but also high speed operations become possible.

BRIEF DESCRIPTION OF THE DRAWINGS

Features, aspects, and embodiments are described in conjunction with the attached drawings, in which.

DETAILED DESCRIPTION

Hereinafter, a domain crossing circuit of a semiconductor apparatus according to various embodiments will be described below with reference to the accompanying drawings through the embodiments.

Figure 1:
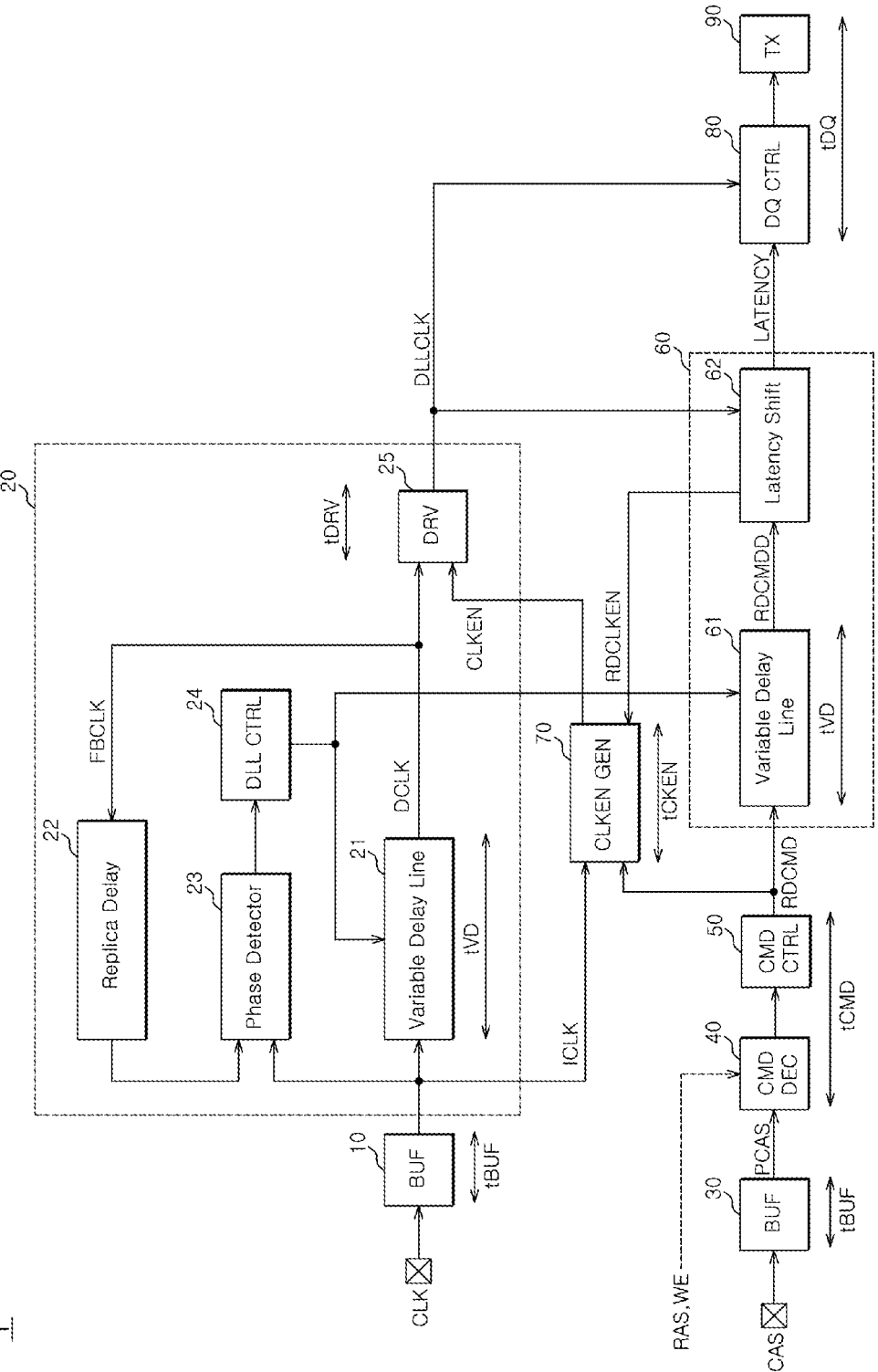
FIG. 1 is a block diagram of a conventional domain crossing circuit of a semiconductor apparatus.
Figure 2:
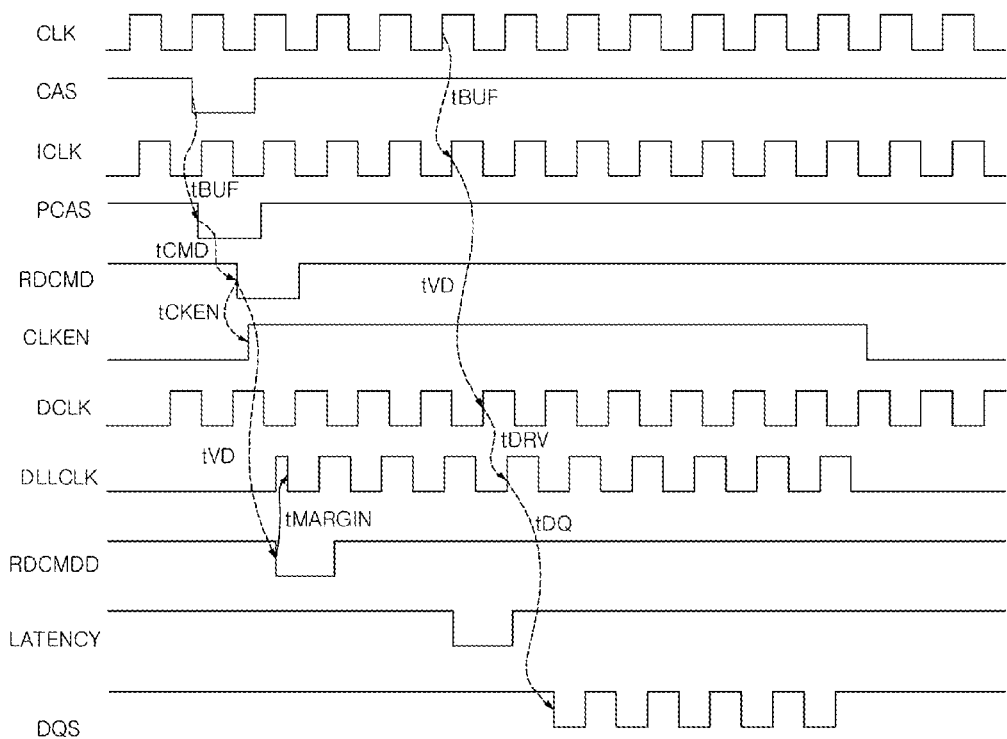
FIG. 2 is an output timing diagram according to FIG. 1.
Figure 3:
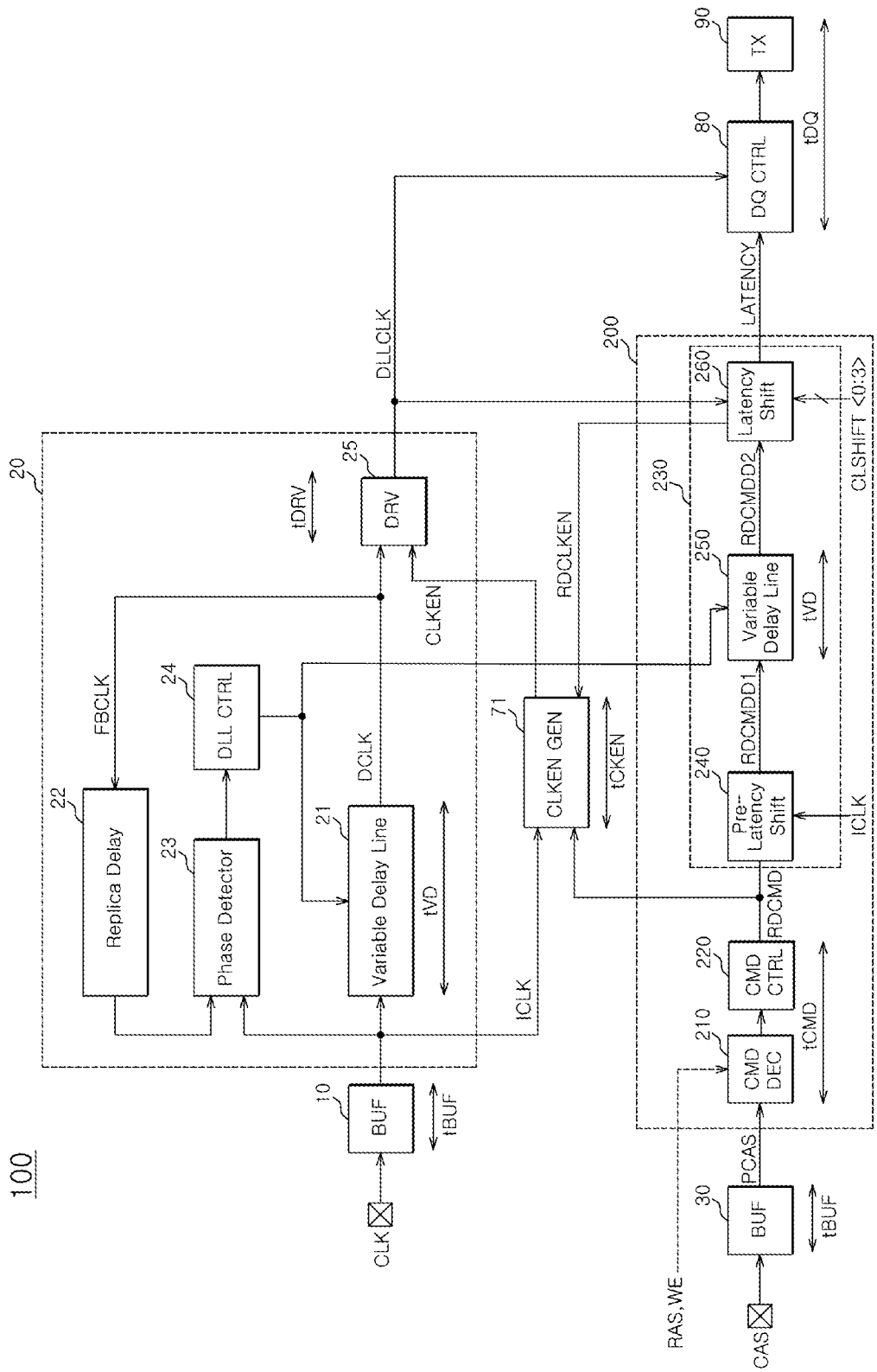
FIG. 3 is a block diagram of a domain crossing circuit of a semiconductor apparatus in accordance with an embodiment.

FIG. 3 is a block diagram of a domain crossing circuit 100 of a semiconductor apparatus in accordance with an embodiment.

Figure 7:
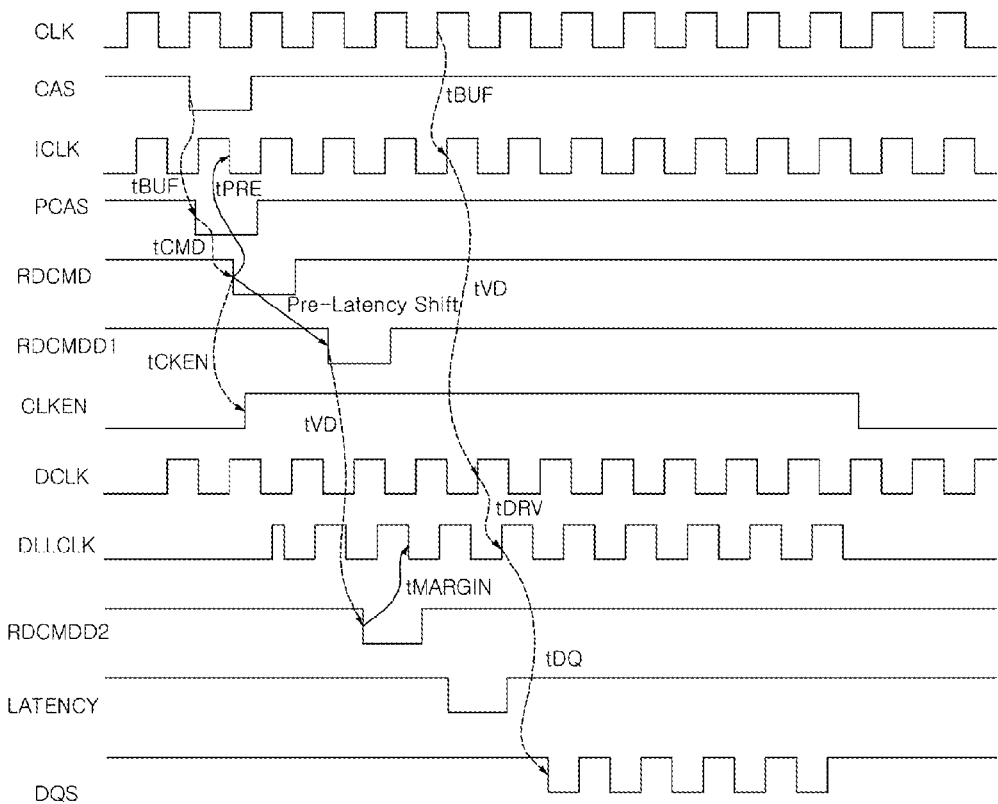
FIG. 7 is an output timing diagram according to FIG. 3.

Referring to FIGS. 3 and 7, the domain crossing circuit 100 of a semiconductor apparatus in accordance with an embodiment may include a first buffer (BUF) 10, a synchronization circuit block 20, a clock enable block (CLKEN GEN) 71, a second buffer (BUF) 30, a command pass block 200, an output timing control block (DQ CTRL) 80, and a transmission block (TX) 90.

The first buffer 10 may be configured to receive an external clock signal CLK and output an internal clock signal ICLK.

The synchronization circuit block 20, that is, a delay-locked loop block 20 may be configured to output a delay-locked loop clock signal DLLCLK in response to the internal clock signal ICLK and a clock enable signal CLKEN.

The delay-locked loop block 20 may be configured to output the delay-locked loop clock signal DLLCLK generated by correcting the delay time of the internal clock signal ICLK, in response to the clock enable signal CLKEN, such that the phases of the internal clock signal ICLK and an output data signal are synchronized.

The delay-locked loop block 20 may include a variable delay line (Variable Delay Line) 21, a replica delay (Replica Delay) 22, a phase detector (Phase Detector) 23, a DLL controller (DLL CTRL) 24, and a driver (DRV) 25. The replica delay 22 may also receive a feedback clock signal FBCLK.

The clock enable block 71 may be configured to generate the clock enable signal CLKEN in response to the internal clock signal ICLK, a read command signal RDCMD and an enable period signal RDCLKEN.

The second buffer 30 may be configured to receive a column address strobe signal CAS and output an internal column address strobe signal PCAS.

The command pass block 200 may be configured to perform primary latency control according to the internal clock signal ICLK, delay time compensation and secondary latency control according to the delay-locked loop clock signal DLLCLK, for the read command signal RDCMD generated in response to the internal column address strobe signal PCAS, and generate a latency signal LATENCY.

The command pass block 200 may include a command decoder (CMD DEC) 210, a command timing control block (CMD CTRL) 220, and a latency control block 230.

The command decoder 210 may be configured to decode the internal column address strobe signal PCAS, a row address strobe signal RAS and a write enable signal WE, and output a command signal.

The command timing control block 220 may be configured to shift the output signal of the command decoder 210 by an address latency (AL), and output the read command signal RDCMD.

The latency control block 230 may be configured to generate the latency signal LATENCY and the enable period signal RDCLKEN in response to the read command signal RDCMD, the internal clock signal ICLK, CAS latency signals CLSHIFT<0:3> and the delay-locked loop clock signal DLLCLK.

The latency control block 230 may include a preliminary shift block (Pre-Latency Shift) 240, a variable delay line (Variable Delay Line) 250, and a shift block (Latency Shift) 260.

The preliminary shift block 240 may be configured to shift the read command signal RDCMD by a predetermined value on the basis of the internal clock signal ICLK, and output a first read command delayed signal RDCMDD1.

The variable delay line 250 may be configured to delay the first read command delayed signal RDCMDD1 by a varied delay time, and generate a second read command delayed signal RDCMDD2.

The varied delay time (i.e., tVD) of the variable delay line 250 may be set to have the same delay time as the variable delay line 21 of the delay-locked loop block 20.

The shift block 260 may be configured to shift the second read command delayed signal RDCMDD2 by a CAS latency (CL) determined by the CAS latency signals CLSHIFT<0:3> on the basis of the delay-locked loop clock signal DLLCLK, and generate the latency signal LATENCY.

The output timing control block 80 may be configured to control the timing of the latency signal LATENCY by a preset value on the basis of the delay-locked loop clock signal DLLCLK, and output a resultant signal.

The transmission block 90 may be configured to perform an operation of outputting data DQ (or DQ and DQS) in response to the output signal of the output timing control block 80.

Figure 4:
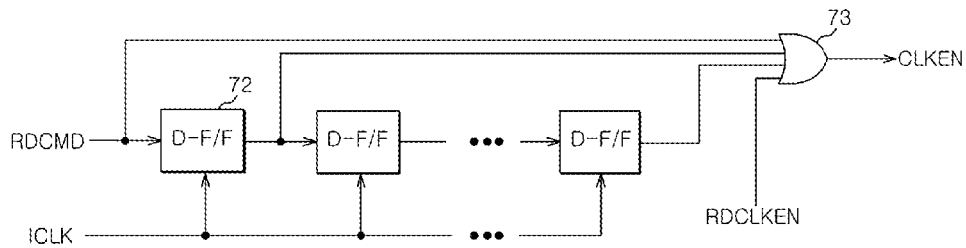
FIG. 4 is a circuit diagram of the clock enable block of FIG. 3.

FIG. 4 is a circuit diagram of the clock enable block 71 of FIG. 3.

Referring to FIG. 4, the clock enable block 71 may include a plurality of flip-flops (D-F/F) 72 and an OR gate 73.

The plurality of flip-flops 72 may sequentially shift the read command signal RDCMD on the basis of the internal clock signal ICLK, and output resultant signals.

The OR gate 73 ORs the read command signal RDCMD, the output signals of the plurality of flip-flops 72 and the enable period signal RDCLKEN, and generates the clock enable signal CLKEN.

Figure 5:
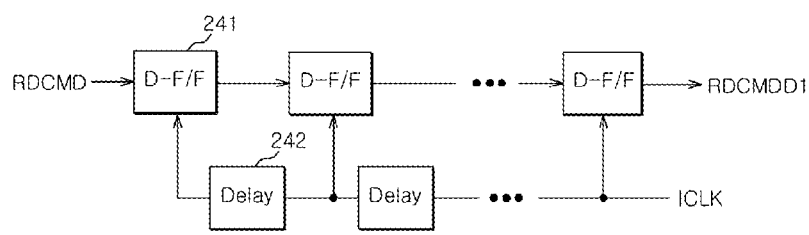
FIG. 5 is a circuit diagram of the preliminary shift block of FIG. 3.

FIG. 5 is a circuit diagram of the preliminary shift block 240 of FIG. 3.

Referring to FIG. 5, the preliminary shift block 240 may include a plurality of flip-flops (D-F/F) 241 and a plurality of delays (Delay) 242.

The plurality of flip-flops 241 may shift the read command signal RDCMD according to the internal clock signal ICLK delayed through the plurality of delays 242, and may generate the first read command delayed signal RDCMDD1.

Figure 6:
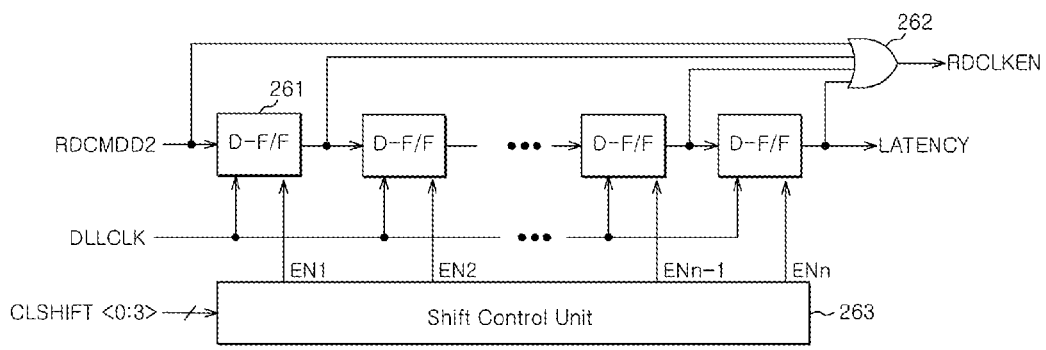
FIG. 6 is a circuit diagram of the shift block of FIG. 3.

FIG. 6 is a circuit diagram of the shift block 260 of FIG. 3.

Referring to FIG. 6, the shift block 260 may include a plurality of flip-flops (D-F/F) 261, an OR gate 262, and a shift control unit 263.

The plurality of flip-flops 261 shift the read command signal RDCMD in response to the delay-locked loop clock signal DLLCLK and control signals EN<1:n>, and generate the latency signal LATENCY.

The OR gate 262 ORs the read command signal RDCMD (i.e., the second read command delayed signal RDCMDD2) and the output signals of the plurality of flip-flops 261, and generates the enable period signal RDCLKEN.

The shift control unit 263 may generate the control signals EN<1:n> in response to the CAS latency signals CLSHIFT<0:3>.

FIG. 7 is an output timing diagram according to FIG. 3.

As can be readily seen from FIGS. 3 and 7, the domain crossing circuit 100 of a semiconductor apparatus in accordance with the embodiments align the read command signal RDCMD with the internal clock signal ICLK by using the preliminary shift block 240.

Accordingly, a timing margin tMARGIN required to shift the second read command delayed signal RDCMDD2 on the basis of the delay-locked loop clock signal DLLCLK in the shift block 260 may be secured sufficiently when compared to the conventional art.

Additionally, FIG. 7 (with regards to FIG. 3) illustrates the following signals: external clock signal CLK, column address strobe signal CAS, internal column address strobe signal PCAS, first read command delayed signal RDCMDD1, clock enable signal CLKEN, delayed clock signal DCLK, latency signal LATENCY, and the output data signal DQS. Also, illustrated in FIG. 7 (with regards to FIG. 3) is the delay time associated with the first or second buffers 10 and 30, tBUF, the timing margin tPRE associated with pre-latency shift block 240, the delay time associated with the command decoder 210 and the command timing control block 220, the delay time associated with the clock enable block tCKEN, the varied delay time tVD, the delay time associated with the driver 25, and the time delay associated with the output timing control block 80 and the transmission block 90, tDQ.

Figure 8:
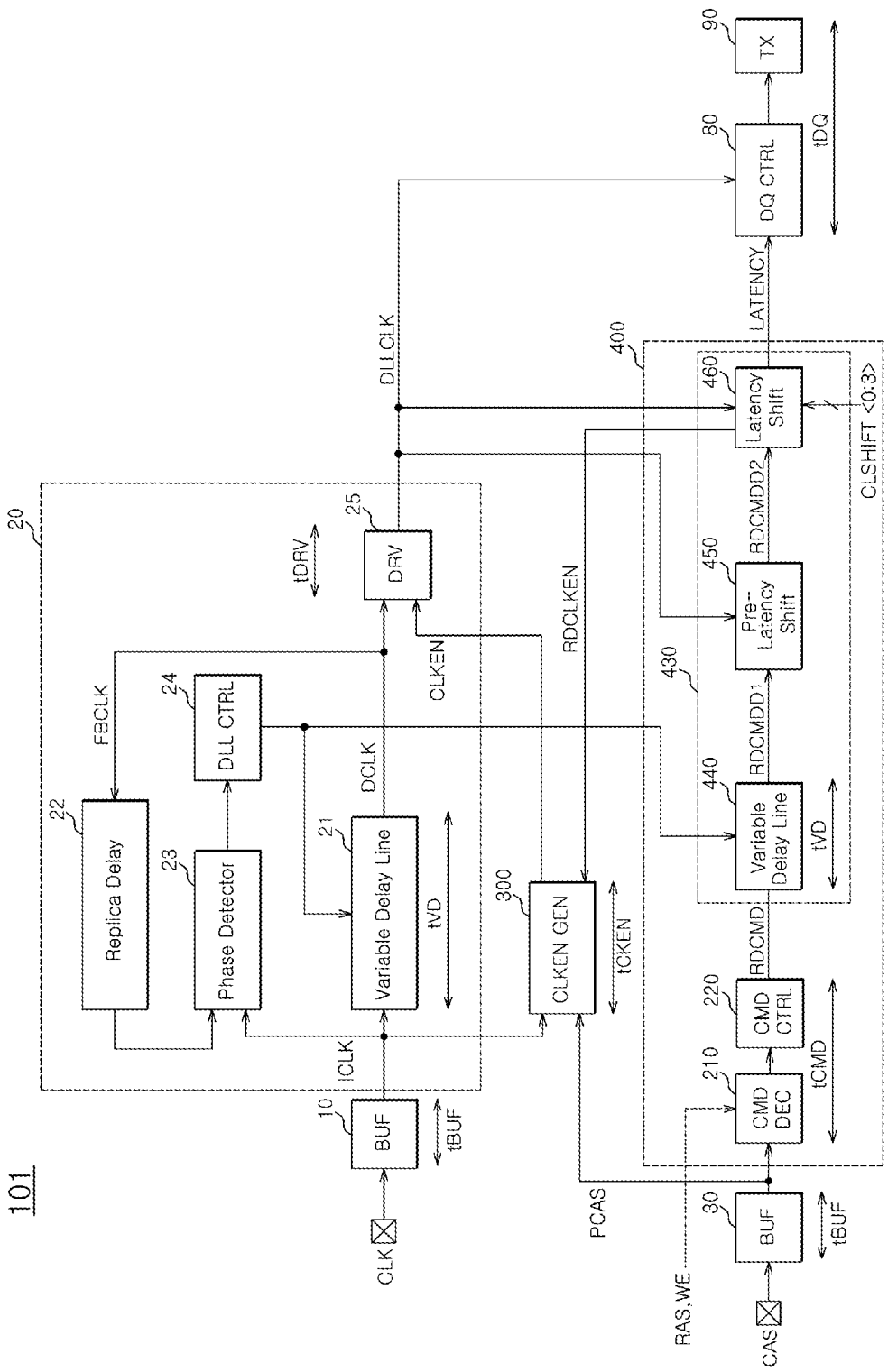
FIG. 8 is a block diagram of a domain crossing circuit of a semiconductor apparatus in accordance with an embodiment.

FIG. 8 is a block diagram of a domain crossing circuit 101 of a semiconductor apparatus in accordance with an embodiment.

Referring to FIG. 8, the domain crossing circuit 101 of a semiconductor apparatus in accordance with an embodiment may include a first buffer (BUF) 10, a synchronization circuit block 20, a clock enable block (CLKEN GEN) 300, a second buffer (BUF) 30, a command pass block 400, an output timing control block (DQ CTRL) 80, and a transmission block (TX) 90.

The first buffer 10 may be configured to receive an external clock signal CLK and output an internal clock signal ICLK.

The synchronization circuit block 20, that is, a delay-locked loop block 20 may be configured to output a delay-locked loop clock signal DLLCLK in response to the internal clock signal ICLK and a clock enable signal CLKEN.

The delay-locked loop block 20 may be configured to output the delay-locked loop clock signal DLLCLK generated by correcting the delay time of the internal clock signal ICLK, in response to the clock enable signal CLKEN, such that the phases of the internal clock signal ICLK and an output data signal are synchronized.

The delay-locked loop block 20 may include a variable delay line (Variable Delay Line) 21, a replica delay (Replica Delay) 22, a phase detector (Phase Detector) 23, a DLL controller (DLL CTRL) 24, and a driver (DRV) 25.

The second buffer 30 may be configured to receive a column address strobe signal CAS and output an internal column address strobe signal PCAS.

The clock enable block 300 may be configured to generate the clock enable signal CLKEN in response to the internal column address strobe signal PCAS, the internal clock signal ICLK, and an enable period signal RDCLKEN.

The command pass block 400 may be configured to generate a latency signal LATENCY as a result of performing compensation of the internal delay time of the delay-locked loop block 20, and primary latency control and secondary latency control according to the delay-locked loop clock signal DLLCLK, for a read command signal RDCMD generated in response to the internal column address strobe signal PCAS.

The command pass block 400 may include a command decoder (CMD DEC) 210, a command timing control block (CMD CTRL) 220, and a latency control block 430.

The command decoder 210 may be configured to decode the internal column address strobe signal PCAS, a row address strobe signal RAS and a write enable signal WE, and output a command signal.

The command timing control block 220 may be configured to shift the output signal of the command decoder 210 by an address latency (AL), and output the read command signal RDCMD.

The latency control block 430 may be configured to generate the latency signal LATENCY and the enable period signal RDCLKEN in response to the read command signal RDCMD, CAS latency signals CLSHIFT<0:3> and the delay-locked loop clock signal DLLCLK.

The latency control block 430 may include a variable delay line (Variable Delay Line) 440, a preliminary shift block (Pre-Latency Shift) 450, and a shift block (Latency Shift) 460.

The variable delay line 440 may be configured to delay the read command signal RDCMD by a varied delay time (i.e., tVD), and generate a first read command delayed signal RDCMDD1.

The varied delay time of the variable delay line 440 may be set to have the same delay time as the variable delay line 21 of the delay-locked loop block 20.

The preliminary shift block 450 may be configured to shift the first read command delayed signal RDCMDD1 by a predetermined delay time on the basis of the delay-locked loop clock signal DLLCLK, and output a second read command delayed signal RDCMDD2.

The shift block 460 may be configured to shift the second read command delayed signal RDCMDD2 by a CAS latency (CL) determined by the CAS latency signals CLSHIFT<0:3> on the basis of the delay-locked loop clock signal DLLCLK, and generate the latency signal LATENCY.

The shift block 460 may be configured in the same manner or substantially the same manner as in FIG. 6.

The output timing control block 80 may be configured to control the timing of the latency signal LATENCY by a preset value on the basis of the delay-locked loop clock signal DLLCLK, and output a resultant signal.

The transmission block 90 may be configured to perform an operation of outputting data DQ (or DQ and DQS) in response to the output signal of the output timing control block 80.

Figure 9:
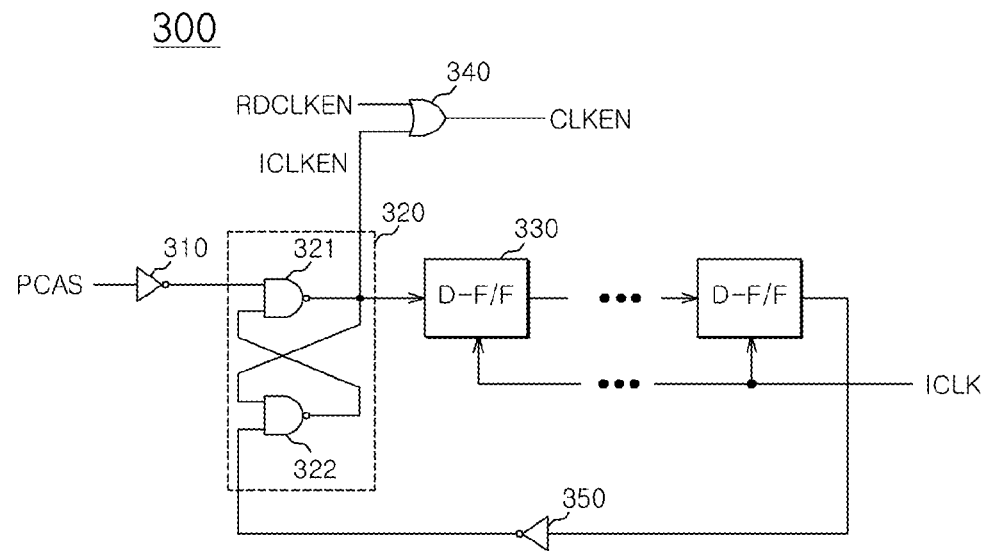
FIG. 9 is a circuit diagram of the clock enable block of FIG. 8.

FIG. 9 is a circuit diagram of the clock enable block 300 of FIG. 8.

The clock enable block 300 may include a plurality of inverters 310 and 350, a latch 320 (including NAND gates 321 and 322), a plurality of flip-flops (D-F/F) 330, and an OR gate 340.

The latch 320 may activate an enable signal ICLKEN in response to the transition of the output of the inverter 310, that is, the transition of the internal column address strobe signal PCAS, and may deactivate the enable signal ICLKEN in response to the output of the inverter 350.

The plurality of flip-flops 330 may shift the enable signal ICLKEN in response to the internal clock signal ICLK and may transfer the shifted enable signal ICLKEN to the inverter 350.

The OR gate 340 ORs the enable signal ICLKEN and the enable period signal RDCLKEN, and generates the clock enable signal CLKEN.

Since the clock enable block 300 may generate the clock enable signal CLKEN in response to the internal column address strobe signal PCAS, the clock enable block 300 according to an embodiment may activate the clock enable signal CLKEN at an earlier time than the clock enable block 71 of FIG. 7.

Figure 10:
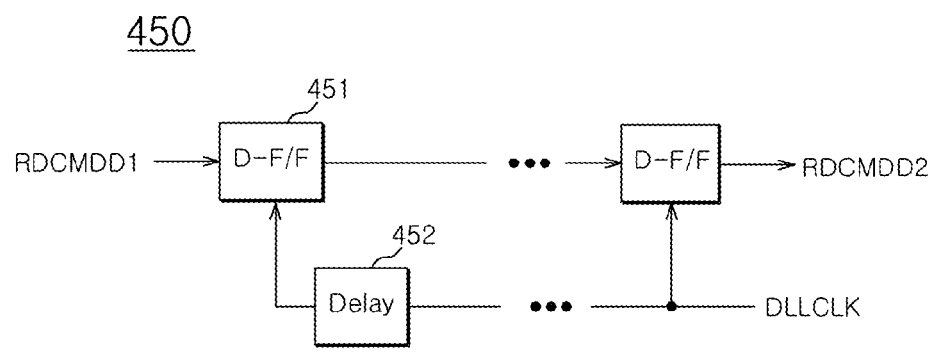
FIG. 10 is a circuit diagram of the preliminary shift block of FIG. 8.

FIG. 10 is a circuit diagram of the preliminary shift block 450 of FIG. 8.

Referring to FIG. 10, the preliminary shift block 450 may include a plurality of flip-flops (D-F/F) 451, and a plurality of delays 452.

The plurality of flip-flops 451 shift the first read command delayed signal RDCMDD1 according to the delay-locked loop clock signal DLLCLK delayed through the plurality of delays 452, and generate the second read command delayed signal RDCMDD2.

In the preliminary shift block 450, the preset delay time for delaying the first read command delayed signal RDCMDD1 is shortened when compared to the embodiments of shown in FIG. 5. Since the preset delay time is shortened, the preliminary shift block 450 may be constituted using a decreased number of flip-flops when compared to FIG. 5, and thus, a circuit area may be reduced. Further, because the delay-locked loop clock signal DLLCLK with a predetermined activation period is used instead of the internal clock signal ICLK which is always activated, current consumption may be reduced.

Figure 11:
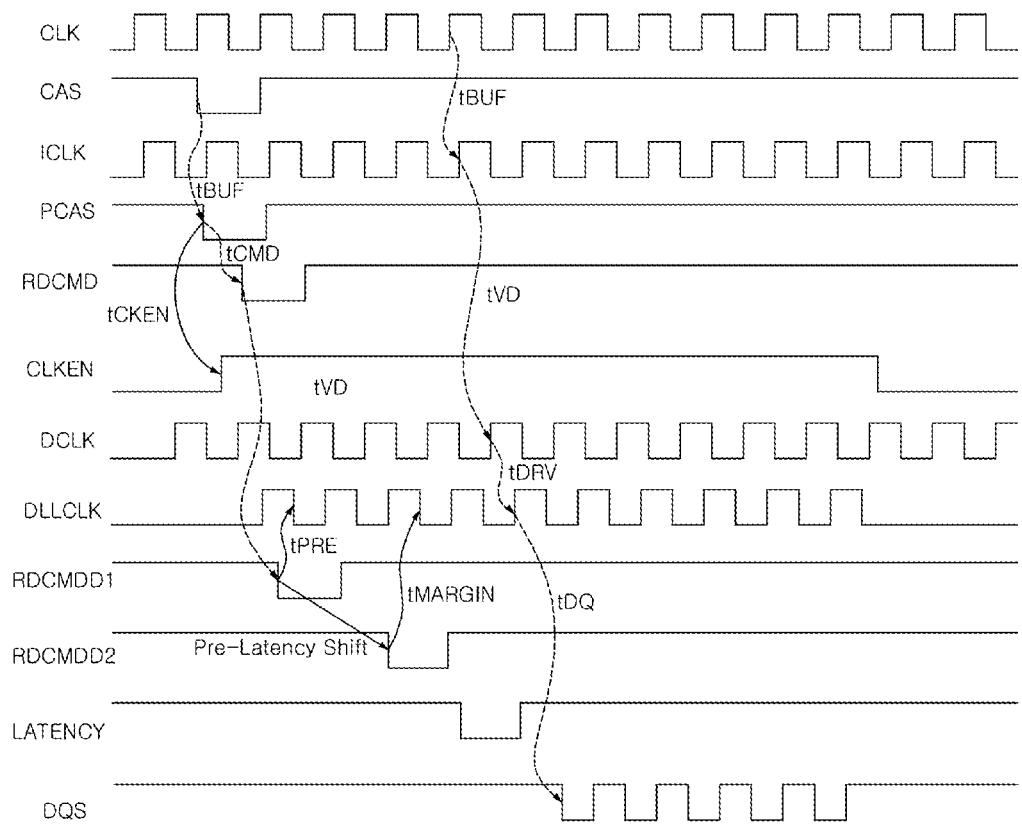
FIG. 11 is an output timing diagram according to FIG. 8.

FIG. 11 is an output timing diagram according to FIG. 8. FIG. 11 illustrates the following signals: internal clock signal ICLK, internal column address strobe signal PCAS, read command signal RDCMD, clock enable signal CLKEN, delayed clock signal DCLK, first read command delayed signal RDCMDD1, second read command delayed signal RDCMDD2, latency signal LATENCY, and the output data signal DQS.

Also, as can be seen from FIG. 11 (see also FIG. 8), in the domain crossing circuit 101 of a semiconductor apparatus in accordance with an embodiment, the delay time from the external clock signal CLK to the delay-locked loop clock signal DLLCLK is tBUF+tVD+tDRV (where tBuf is the delay time associated with the first buffer 10, tVD is the delay time associated with the variable delay line 21, and tDRV is the delay time associated with the driver 25), and the delay time from the column address strobe signal CAS to the first read command delayed signal RDCMDD1 is tBUF+tCMD+tVD (where tBUF is the delay time associated with the second buffer 30, tCMD is the delay time associated with the command decoder 210 and the command timing control block 220, and tVD is the delay time associated with the variable delay line 440).

Therefore, a delay time required to align the first read command delayed signal RDCMDD1 with the delay-locked loop clock signal DLLCLK in the preliminary shift block 450 is tCMD–tDRV.

That is to say, since a delay time to be withstood by the preliminary shift block 450 is shortened, the circuit configuration of the preliminary shift block 450 according to the present embodiments may be simplified when compared to the preliminary shift block 240 of the aforementioned embodiments.

The first read command delayed signal RDCMDD1 is aligned with the delay-locked loop clock signal DLLCLK using the preliminary shift block 450.

Accordingly, a timing margin tMARGIN required to shift the second read command delayed signal RDCMDD2 on the basis of the delay-locked loop clock signal DLLCLK in the shift block 460 may be secured sufficiently when compared to the conventional art.

Moreover, since the first read command delayed signal RDCMDD1 generated through the variable delay line 440 is aligned on the basis of the delay-locked loop clock signal DLLCLK, the timing margin tPRE of the preliminary shift block 450 is increased.

Hence, in an embodiment, the timing margins tMARGIN and tPRE are sufficiently secured so that not only stable operations but also high speed operations become possible.

While various embodiments have been described above, it will be understood to those skilled in the art that the embodiments described are by way of example only. Accordingly, the domain crossing circuit of a semiconductor apparatus described herein should not be limited based on the described embodiments.

What is claimed is:

1. A domain crossing circuit of a semiconductor apparatus, comprising:
   a delay-locked loop block configured to generate a delay-locked loop clock signal in response to a clock signal and a clock enable signal;
   a clock enable block configured to generate the clock enable signal in response to the clock signal and a read command signal; and a command pass block configured to generate a latency signal by performing primary latency control according to the clock signal and secondary latency control according to the delay-locked loop clock signal, for the read command signal generated in response to a strobe signal.

2. The domain crossing circuit according to claim 1, wherein the clock enable block comprises:
   a plurality of flip-flops configured to sequentially shift the read command signal on the basis of the clock signal, and output resultant signals; and
   a logic gate configured to OR the read command signal and output signals of the plurality of flip-flops, and generate the clock enable signal.

3. The domain crossing circuit according to claim 1, wherein the command pass block is configured to perform compensation of a delay time corresponding to an internal delay time of the delay-locked loop block, between the primary latency control and the secondary latency control.

4. The domain crossing circuit according to claim 3, wherein the command pass block comprises:
   a preliminary shift block configured to shift the read command signal by a predetermined value on the basis of the clock signal and generate a first read command delayed signal;
   a variable delay line configured to delay the first read command delayed signal by a varied delay time and generate a second read command delayed signal; and
   a shift block configured to shift the second read command delayed signal by a CAS latency determined by CAS latency signals, on the basis of the delay-locked loop clock signal, and generate the latency signal.

5. The domain crossing circuit according to claim 4, wherein the varied delay time of the variable delay line is set to have the same delay time as the delay time of the delay-locked loop block.

6. The domain crossing circuit according to claim 4, wherein the preliminary shift block comprises:
   a plurality of delays configured to sequentially delay the clock signal; and
   a plurality of flip-flops configured to shift the read command signal according to the clock signal delayed through the plurality of delays and generate the first read command delayed signal.

7. The domain crossing circuit according to claim 4, wherein the shift block comprises:
   a plurality of flip-flops configured to shift the read command signal in response to the delay-locked loop clock signal and control signals and generate the latency signal; and
   a shift control unit configured to generate the control signals in response to the CAS latency signals.

8. The domain crossing circuit according to claim 1, wherein the clock enable block is configured to generate the clock enable signal in response to the clock signal, the read command signal and an enable period signal.

9. The domain crossing circuit according to claim 8, wherein the command pass block comprises:
   a command decoder configured to decode the strobe signal, a row address strobe signal and a write enable signal and output a command signal;
   a command timing control block configured to shift an output signal of the command decoder by an address latency and output the read command signal; and
   a latency control block configured to generate the latency signal and the enable period signal in response to the read command signal, the clock signal, the CAS latency signals and the delay-locked loop clock signal.

10. The domain crossing circuit according to claim 9, wherein the latency control block comprises:
    a preliminary shift block configured to shift the read command signal by a predetermined value on the basis of the clock signal and generate a first read command delayed signal;
    a variable delay line configured to delay the first read command delayed signal by a varied delay time and generate a second read command delayed signal; and
    a shift block configured to shift the second read command delayed signal by a CAS latency determined by the CAS latency signals, on the basis of the delay-locked loop clock signal, and generate the latency signal and the enable period signal.

11. The domain crossing circuit according to claim 10, wherein the shift block comprises:
    a plurality of flip-flops configured to shift the second read command delayed signal in response to the delay-locked loop clock signal and control signals and generate the latency signal;
    a logic gate configured to OR the second read command delayed signal and output signals of the plurality of flip-flops and generate the enable period signal; and
    a shift control unit configured to generate the control signals in response to the CAS latency signals.

12. The domain crossing circuit according to claim 11, wherein the clock enable block is configured to generate the clock enable signal in response to the clock signal, the read command signal, and the enable period signal generated and received from the shift block.

* * * * *